United States Patent [19]

Kahn

[11] 4,295,106
[45] Oct. 13, 1981

[54] METHOD AND MEANS FOR INTRODUCING ADDITIONAL ASYMMETRY INTO AUDIO WAVES

[76] Inventor: Leonard Kahn, 137 E. 36 St., New York, N.Y. 10016

[21] Appl. No.: 81,631

[22] Filed: Oct. 4, 1979

[51] Int. Cl.³ .................... H03C 1/00; H03G 11/00; H03K 5/153
[52] U.S. Cl. ............................. 332/37 R; 328/150; 328/168; 332/38; 455/108
[58] Field of Search ............... 332/31 R, 37 R, 38; 455/108; 179/1 A; 307/351; 328/31, 32, 150, 168, 169, 171

[56] References Cited

U.S. PATENT DOCUMENTS

| | | | |
|---|---|---|---|
| 2,316,567 | 4/1943 | Davis | 455/108 X |
| 3,060,389 | 10/1962 | Kahn | 332/38 |
| 3,247,457 | 4/1966 | Kaenel | 328/150 X |
| 3,320,536 | 5/1967 | Lockwood | 332/38 X |
| 3,370,294 | 2/1968 | Kahn | 343/180 |
| 4,064,408 | 12/1977 | Hon et al. | 328/150 X |
| 4,143,325 | 3/1979 | Kahn . | |
| 4,150,253 | 4/1979 | Knoppel | 179/1 R |

OTHER PUBLICATIONS

"Transmission Systems for Communications," 4th Edition, Feb. 1970, Western Electric Co., Inc., Technical Publications, Winston-Salem, N.C., pp. 82–83.
Radio Engineers' Handbook, F. E. Terman, McGraw-Hill, NY, 1943, pp. 593–596.

Primary Examiner—Siegfried H. Grimm

[57] ABSTRACT

Audio processing equipment for introducing additional asymmetry so as to provide increased fullness of modulation of associated transmitters. Audio waveshapes are altered so as to accentuate the positive going portions of the waveshape. The alteration of the waveshape is typically such that the waveshape will produce positive going modulation of approximately 125% when the negative going modulation is approximately 100%.

16 Claims, 10 Drawing Figures

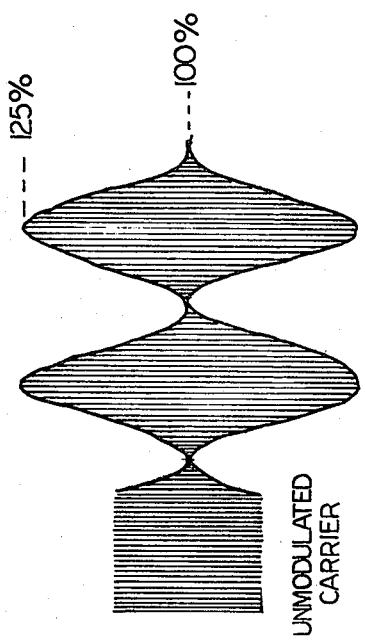
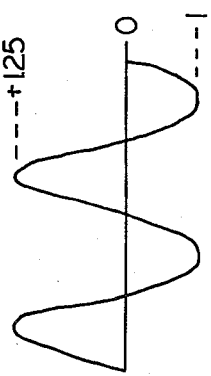
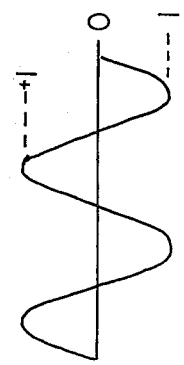
FIG. 7A
FIG. 7B
FIG. 7C
FIG. 7

METHOD AND MEANS FOR INTRODUCING ADDITIONAL ASYMMETRY INTO AUDIO WAVES

BACKGROUND OF THE INVENTION

While the invention is subject to a wide range of applications, it is especially suited for use in amplitude modulation broadcasting systems where it is desirable to provide large amounts of envelope modulation and will be particularly described in this connection.

Broadcasters are limited, by their power and frequency assignments, in their attempts to cover as large an area as possible. Accordingly, broadcasters in general, and AM broadcasters specifically, have tended to use sophisticated audio processors for maximizing effective modulation.

The present rules covering AM medium wave broadcasting in the United States allow broadcasters to produce up to 100% negative going modulation and 125% positive going modulation.

Audio processing equipment, according to one preferred embodiment of this invention, will alter the waveshape of the input audio signal in such a manner as to cause high effective modulation with positive going peak modulation approximately 125% and peak negative going modulation approximately 100%, the limit allowed by many Governmental regulatory bodies.

Presently, there are two basic procedures used for producing asymmetrical modulation. The first is to use two clippers, one set to clip at a voltage level providing 125% positive going modulation, and the second at minus 100% modulation. The audio level is then set high enough to insure that the audio input reaches and exceeds the clipping level of the 125% clipper. Thus, if the signal into the clippers is essentially symmetrical, the clippers would, by their asymmetrical adjustments, create an asymmetrical modulated wave.

The second procedure is to use the essential asymmetrical nature of certain audio signals, such as, many speech waves produced by good radio voices. It is, however, necessary to insure the proper polarity of the asymmetrical characteristic to provide higher positive modulation. Equipment has been in use, for a number of years, which automatically switches the phase of the audio wave by 180 degrees, whenever the polarity of the wave is wrong.

These procedures avoid the use of clippers but do not insure asymmetrical modulation for all signals nor do they insure the correct amount of asymmetry. AM broadcasters often use a combination of the first and second basic procedures but this introduces clipper distortion products.

SUMMARY OF THE INVENTION

Features and advantages of the present invention accrue from the avoidance or at least reduction of the use of diode clippers and other clipping type devices.

A general object of the invention is to provide a method and means of achieving asymmetrical modulation from signals having little or no asymmetry without introducing excessive total harmonic distortion and without introducing even harmonic distortion. A further advantage is to substantially reduce distortion even when clippers are used.

A still further advantage is the reduction of sideband splatter thus reducing interference.

The invention provides improved asymmetrical amplitude modulation by generally following the steps of splitting a substantially symmetrical audio wave into its positive and negative polarity segments, supplying two separate paths, at least for some portion of the path to an associated transmitter's modulator, both of which paths are essentially linear but the path for the segment that causes positive going modulation has a higher transmission gain.

However, in preferred embodiments of the invention, the path having the higher transmission gain only has greater gain when the portion of the wave having the proper polarity to cause positive going modulation exceeds a predetermined level and the enhancement discontinues subsequent to the time when the portion of the wave causing positive going modulation drops below the predetermined level.

It is necessary, in producing the preferred embodiments of this invention, to peak detect the portion of the wave to be enhanced. Since it is important, in many situations, to utilize a detector with a short decay time while it is necessary to hold the peak detector output constant at least for a short period of time, an improved detector is required to best practice the overal invention.

Such an improved detector may be constructed, comprising, (a) A first rectification means wth its input terminal coupled to the wave being detected.

(b) One or more additional rectification means.

(c) One or more time delay means through which at least a sample of the wave being detected is passed and if a plurality of delay means are provided, said delay means connected so as to provide a total delay equal to the sum of the delays of the individual delay means.

(d) Means for connecting the input terminals of the one or more (b) rectification means to the one or more output terminals of (c) delay means, and, (e) Combining means connected to the output terminals of the (a) and (b) rectification means.

The above stated objects and other objects, features, characteristics, and advantages of the systems and methods of the invention, will be apparent from the following description of certain typical forms thereof taken together with the accompanying drawings.

BRIEF DESCRIPTION OF THE DRAWINGS

FIGS. 7A, 7B and 7C show waveshapes indicating how this invention alters such waveshapes.

DETAILED DESCRIPTION OF PREFERRED EMBODIMENTS

Figure 1:
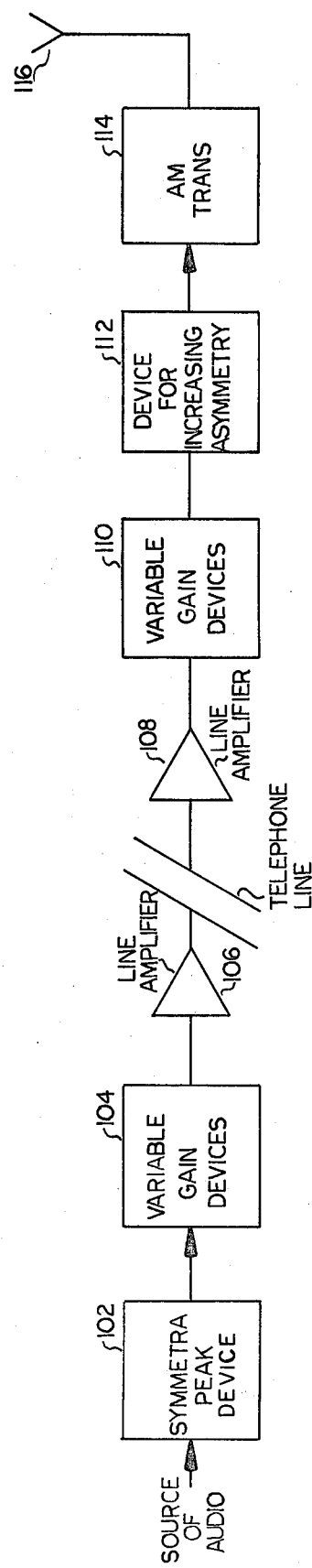
FIG. 1 shows a simplified overall block diagram of a radio station equipped with a device called Symmetra-Peak showing how the present invention would fit into such a station.

FIG. 1 is a simplified block diagram of sections of a typical AM broadcast station using a Symmetra-Peak audio processor which is pertinent to the instant invention. A source of audio, such as an output, after amplification, of a microphone or disc or tape playback device feeds a Symmetra-Peak audio processor built in accordance with U.S. Pat. No. 3,060,389 and manufactured by Kahn Communications, Inc., 839 Stewart Avenue, Garden City, N.Y. 11530, converts asymmetrical waveshapes to waveshapes having essentially a symmetrical character; i.e., the positive polarity peaks approximate the negative polarity peaks.

The Symmetra-Peak device is in use by many broadcasters despite the fact that it causes asymmetrical waves to approximate symmetrical waves because it accomplishes this by reducing peaks, thus allowing high effective modulation without clipping, Furthermore, since the output of the Symmetra-Peak device is symmetrical, there is no need to provide automatic equipment for switching the polarity of the wave to insure against negative going modulation exceeding positive going modulation. However, the disadvantage of the use of Symmetra-Peak equipment is that it denies the broadcaster the opportunity to make full use of 125% positive going modulation without the introduction of clipping.

The relatively symmetrical wave output of block 102 feeds a variable gain device 104. Such variable gain devices are extensively used in the broadcast industry so as to maintain relatively constant level with wide changes of level of the speech and music. One such device is the Discriminate Audio Processor AGC-Peak Limiter, model 310, manufactured by Dorrough Electronics, Woodland Hills, California. The output of block 104, feeds a line amplifier 106, which is generally a constant gain amplifier which produces the proper amplitude of signal at a suitable impedance to feed the telephone line or other means of transmitting the audio signal from the studio to the transmitter building.

At the transmitter site, the telephone line is often fed to a line amplifier which is used to make up for overall line loss. The output of line amplifier 108, feeds a variable gain device 110 which can be the same type of device as used in block 104 and which acts to maintain relatively constant output level and thereby provides high average modulation. There are many types of such devices in use by broadcasters including devices that use nonlinear devices such as clippers.

While a clipper is very effective in increasing the energy of a wave for a given maximum peak value of the wave, and can be used to introduce asymmetry, such devices can introduce substantially amounts of distortion which can degrade the quality of the received sound to a point where even some loss in intelligibility may be suffered and music may sound harsh and unpleasant. Furthermore, the distortion introduces harmonic and intermodulation terms that can cause an increase of bandwidth and sideband splatter, which in turn causes adjacent channel interference problems.

In the present case, the portion of device 110 which introduces clipping would best be disabled because the present invention provides asymmetry without the severe distortion produced by clippers.

Accordingly, in the preferred embodiment, variable gain device 110 will operate without clipping and feeds block 112 which produces an asymmetrical wave typically of proper waveshape to cause positive peak modulation of 125% and negative peaks of 100%.

The audio wave feeds a conventional AM transmitter which in many cases will incorporate clippers as protective devices to protect the transmitter and the antenna system from excessive peak levels and as a further safeguard against illegal excessive modulation. The transmitter produces a modulated wave which in turn feeds antenna 116.

Figure 2:
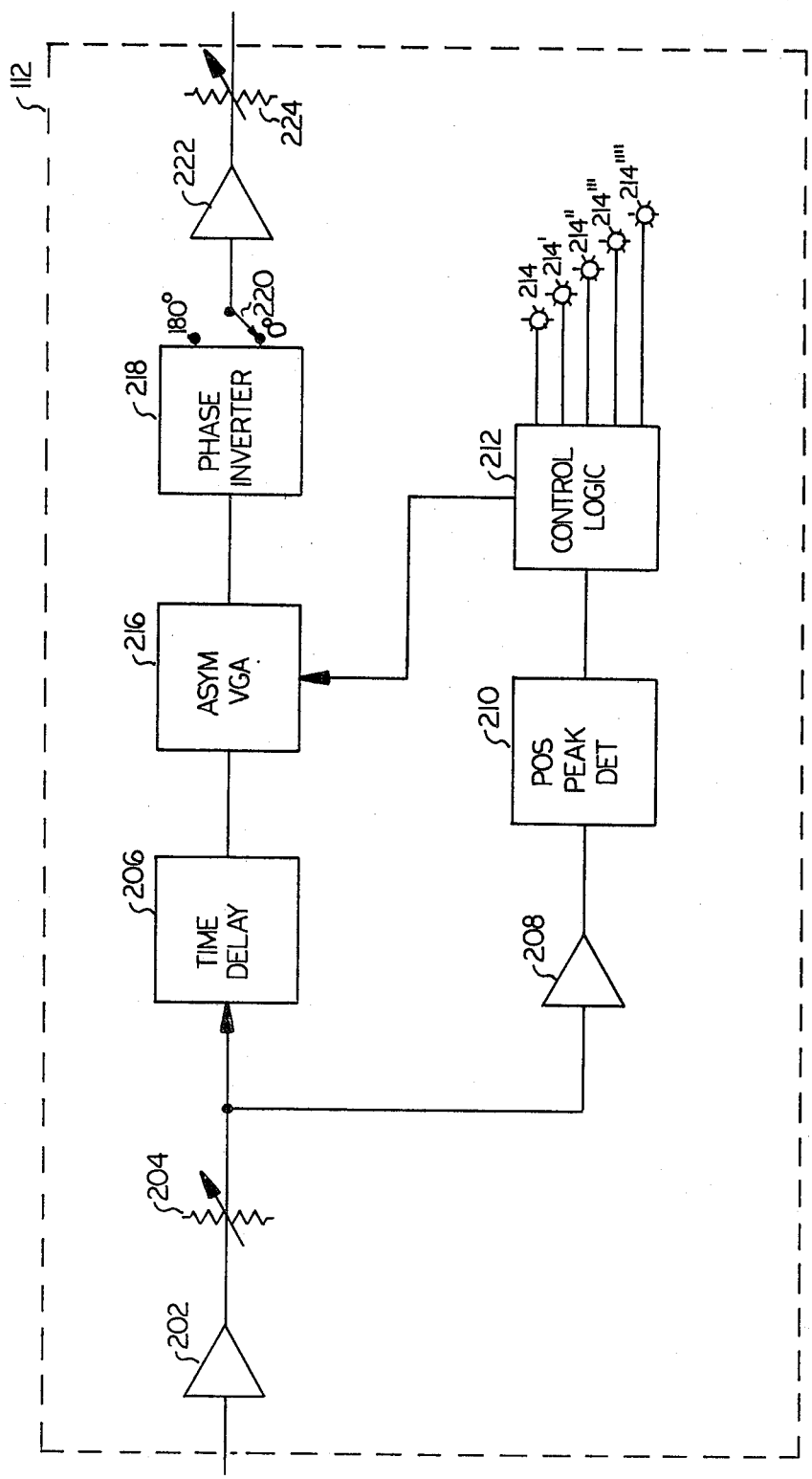
FIG. 2 is a block diagram of one configuration of the present invention.

FIG. 2 is a block diagram of one embodiment of the present invention. As shown in FIG. 1 of this equipment, the new equipment is incorporated between blocks 110 and the transmitter 114 and is identified as block 112. The input of block 112 is amplified in block 202, if necessary, and fed to a gain adjust potentiometer 204 which feeds time delay 206 and also amplifier 208. The level at the input to the peak detector 210 is set to provide the peak enhancement effect desired.

Peak detector circuit 210 produces an output which is a function of the peaks of the voltage having the correct polarity to cause positive going modulation. Peak detector 210 should have a fast charge/slow decay characteristic. This circuit, which is of a type well known to those skilled in the design of electronic circuits, allows the circuit to reach approximately full level in a short period of time, for example, 20 usec, and hold the voltage for a larger period of time, for example, 20 millisecond.

Peak detector 210 may be replaced by a new type of peak detector which is described below and which provides quicker recovery response for a given droop time.

The output of block 210 feeds a control/logic circuit 212. Block 212 incorporates one or more comparison circuits which compare(s) the voltage fed to block 212 with a preset voltage(s). If the voltage exceeds the comparison voltage, the logic circuit switches in control voltages to the asymmetrical VGA circuit.

The control/logic circuit 212 can also control lamps such as 214 to indicate that a predetermined positive peak level is exceeded and that the VGA 216 is being controlled. One preferred embodiment would provide a multiplicity of comparators, each controlling separate control circuits, which can cause VGA 216 to provide different amounts of positive modulation enhancement. Also, additional lamp control circuits may be incorporated in block 212 and used to illuminate additional lamps, such as 214' and 214", etc. Block 212 is described in further detail below.

Control 204, besides setting the level fed to amplifier 208, establishes the level fed to time delay circuit 206. This time delay is provided so as to allow time for the control circuit, comprising blocks 208, 210 and 212, to react to signals requiring enhancement. However, as discussed below, the introduction of time delay can, in certain situations, be disturbing to station personnel. Accordingly, under normal operating conditions, the delay should be limited to small amounts; i.e., less than 10 ms and in some cases eliminated with loss of enhancement of the initial portion of certain sounds.

As described below, in the description of FIG. 6, solid state delay circuits may be used for time delay circuit, for example, the SAD 1024A, as manufactured by Reticon Corporation, Sunnyvale, Calif.

The clock, which must be included to control the SAD 1024A, can use a CD 4049AE as manufactured by RCA, Somerville, N.J., and can be made variable to alter the amount of delay. Of course, if it is determined that no delay should be used, the time delay may be switched out or the time delay block 206 deleted.

The output of time delay block 206 feeds the input of asymmetrical VGA 216.

The output of control logic 212 controls the asymmetrical VGA 216 which enhances the voltage which will provide increased positive going modulation. It is desirable to provide constant gain expansion over approximately the entire 180° of the enhanced alteration of the wave so as to minimize the odd harmonics of the output wave.

Figure 3:
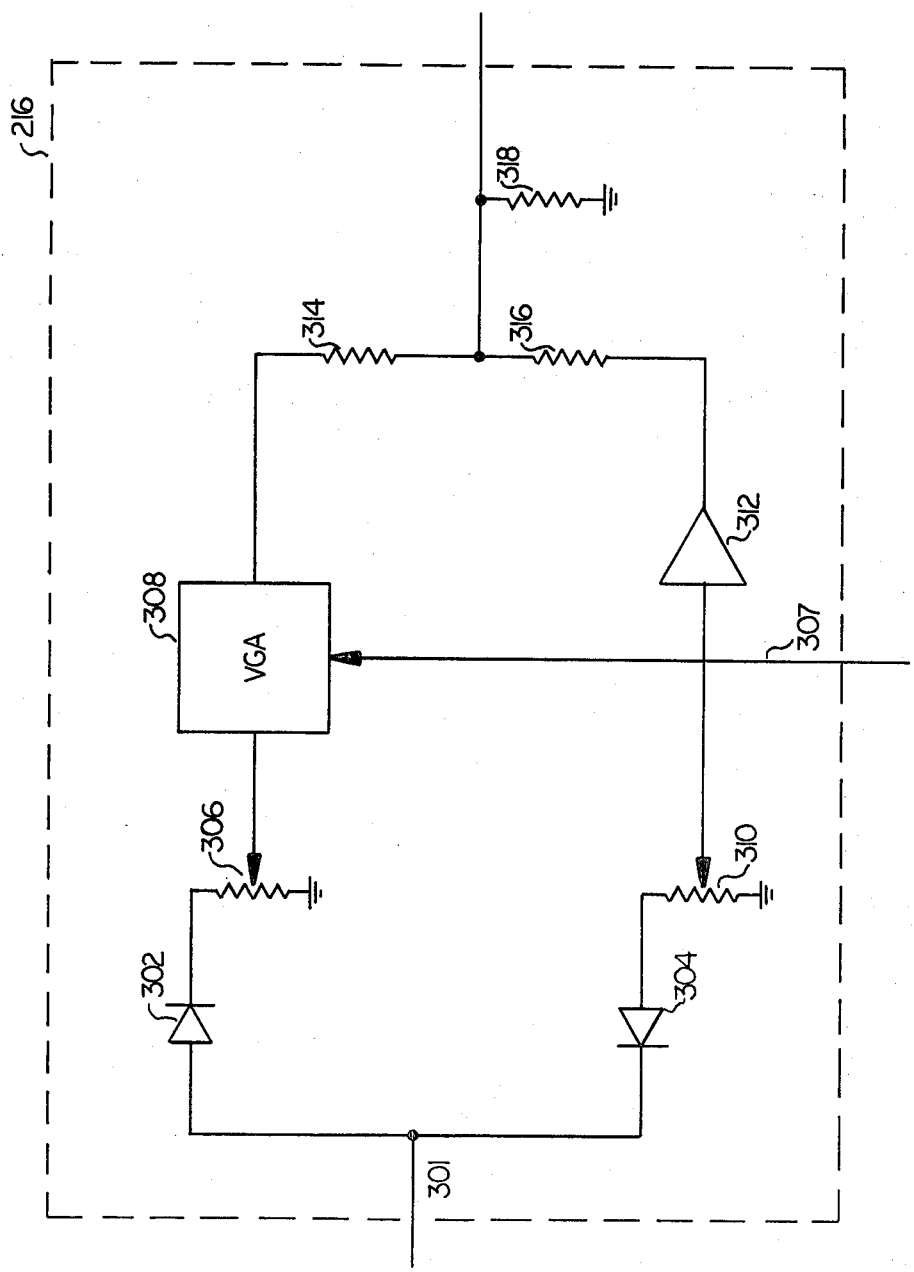
FIG. 3 shows, in some detail, one type of asymmetrical VGA which may be used in the overall block of FIG. 2.

FIG. 3 shows one circuit that can be used for asymmetrical VGA service. The detailed description of the asymmetrical VGA circuit is provided below.

The output of the asymmetrical VGA block 216, feeds phase inverter 218. This device provides two outputs, one in phase with the input; i.e., the 0 degree output, and the other, out of phase; i.e., the 180 degree port. One type of circuit that can be used for such service is a transistor connected so as to feed audio to its base and with equal value resistors in the emitter and collector circuits. The voltage across the emitter will be in phase with the signal fed to the base and the voltage across the resistor in the collector circuit will be out of phase. For further information concerning phase inverters, see pages 211–212, 383–385 of Electronic Circuits; Discrete and Integrated, D. L. Schilling and C. Belove, McGraw-Hill, N.Y., 1968.

The outputs of phase inverter 218 are connected to switch 220 which allows the user to switch polarity of the wave either causing the positive polarity of the wave to be enhanced or the negative portion of the wave. Since most transmitters presently in use utilize one or more transformers which may be wired to cause phase inversion and since transmitters may use amplifiers with a net in-phase or out-of-phase configuration, it is desirable to accommodate such differences by providing switch 220 to allow convenient switching of phase so as to insure the proper enhancement effect.

As discussed above, the normal switch position will cause an enhancement of the positive going modulation of amplitude modulation transmitters.

The arm of switch 220 is connected to amplifier 222 which in turn feeds potentiometer 224 which allows the level to be set. Further amplification may be provided and clipping means may be supplied.

If clipping is used, the system may be adjusted to provide protection against occasional high level peaks or it may be used to provide clipping effects for increasing the average level of the modulation.

Generally, in the case of using clipping for increased modulation, the negative going clipping would first be used but even positive peaks can be clipped. Of course, such clipping increases distortion, especially odd order harmonic distortion. But many stations will accept some substantial degree of distortion for increased loudness. The overall effect of using the instant invention with some amount of clipping would result in less distortion than a system that completely relies upon clipping to provide the asymmetrical characteristic.

One practical problem must be considered when applying the embodiment of the invention shown in FIG. 2 to many broadcast operations. This is the effect of time delay as introduced in block 206.

It is noted in experiments at one broadcast station that the individuals that spoke over the station were disturbed by the delay in the signal path even though a delay of only 10 ms was initially introduced. When the delay was reduced to 6 ms the problem was apparently reduced to a point where it was acceptable for the overall system used by the test station.

Time delay problems are known to telephone engineers and have resulted in the development of echo suppressors. (See Transmission Systems for Communications, 4th Edition, February 1970, Western Electric Co., Inc. Technical Publications, Winston-Salem, North Carolina, pp. 82–83), and U.S. Pat. No. 3,370,294 issued Feb. 20, 1968, discloses one type of echo suppressor.)

However, delays of 10 ms or less are generally tolerated in telephone systems. In the instant case, such short delays can be disturbing because of a number of reasons. One major reason is that broadcast announcers listen (monitor) at elevated sound levels and the echo problem increases in severity as the level increases. Also, it should be noted that the present equipment is not the sole source of delay in the circuit between the microphone and the on-the-air monitor output fed to the announcer. For example, the transmitter may be located some distance from the studio and the transmission circuit, between the two points, may introduce appreciable time delay.

Of course, some stations are automated and the announcements would not be transmitted in real time and in this case the delay would not pose a problem. However, at the present time the vast majority of stations are not automated and, accordingly, a time delay of less than 10 ms should be used for block 206 and, indeed, provisions should be made to switch out the time delay. Of course, the shorter the delay used, the smaller the time available for the system to respond to the initial segments of the sounds requiring the non-symmetrical enhancement. This precludes the use of significant amounts of lowpass filtering to eliminate audio ripple in the positive peak detector 210 because of the time delay inherent in such filters.

Fortunately, it is possible to significantly reduce ripple, generated in peak detectors, without significantly slowing response and without introducing long hang time characteristics. This matter will be discussed in detail in the description of FIG. 6.

FIG. 3 shows a simplified block/schematic drawing of one type of asymmetrical VGA that may be used in FIG. 2. The audio wave from time delay block 206, if a time delay is used, feeds line 301 which in turn feeds rectifier means 302 and 304. It should be noted that these diodes are connected with their anode and cathode connected to the input line 301. Accordingly, assuming a signal voltage, appreciably above the contact voltage of the type of diode, is used, the signal is split into two polarities. The positive polarity portion of the signal wave passes through diode or rectifier means 302 and the negative portion of the wave passes through diode 304.

If the signal level is insufficient to overwhelm the contact potential of diodes 302 and 304 a dc bias may be fed to the diodes (negative to the cathode of diode 302 and positive to the anode of 304) to reduce the effect of the contact potential.

The positive portion of the wave is passed through potentiometer 306 to set level and this wave is in turn fed to a variable gain amplifier 308 which may be an integrated circuit. The output of VGA 308 feeds resistor 314 which in turn feeds the controlled positive portion of the wave to resistor 318.

The negative portion of the wave, after passing through diode 304, is corrected in level by adjustment of potentiometer 310 which in turn feeds an amplifier 312. The output of amplifier 312 is passed through resistor 316 to load 318 where it is combined with the positive portion of the wave.

When the input level of the system is below the point where the signal does not require positive modulation enhancement, VGA 308 should have a gain such as to cause equal transmission through the positive polarity wave path and the negative polarity wave path. Potentiometers 306 and 310 can be adjusted to insure this condition.

However, when enhancement is required, the gain of VGA 308 should be raised, producing the desired asymmetry. A dc control voltage from control logic block 212 generates the proper voltage to cause VGA 216 to increase its gain by the desired enhancement factor.

Feedback may be used around the circuit splitting polarity; i.e., diodes 302 and 304, to provide lower unenhanced distortion figures.

It is noteworthy, that the process of introducing asymmetry will introduce a change in the average level of the signal; i.e., a dc voltage shift.

Since most transmitters presently in use do not incorporate direct coupled amplifiers in the audio modulation system, the dc voltage shift must be removed after a period of time. However, since voice and music waves are of a transitory nature, the loss of the dc component after a long period will be of no serious concern in most cases. But it is important to utilize coupling circuits with good low frequency response and, better still, dc amplifiers.

Furthermore, in order to enjoy the full advantages of this invention, it may be necessary to phase and amplitude equalize the associated transmitter, especially for low frequencies, to ensure proper transmission of the enhanced waveshape. A similar problem, but in some respects more severe, is experienced when attempting to introduce clipping circuits into a system where the transmitter's modulation system has poor phase and amplitude response characteristics which introduce tilt and other forms of waveshape distortion negating the advantages of clipping. Fortunately, equalization techniques, even though sometimes expensive to use, are generally most effective. Such techniques are well known to broadcast transmitter designers.

It should be noted that an enhancement system consisting solely of the block of FIG. 3, plus suitable input and output amplifiers, can be used to provide the enhancement effect. However, even though such an arrangement would be economical it would cause additional distortion.

Furthermore, in the case of most transmitters, the ac coupled amplifiers would build up an offset which would tend to reduce the desired positive going modulation and providing enhancement of the negative going modulation.

Figure 4:
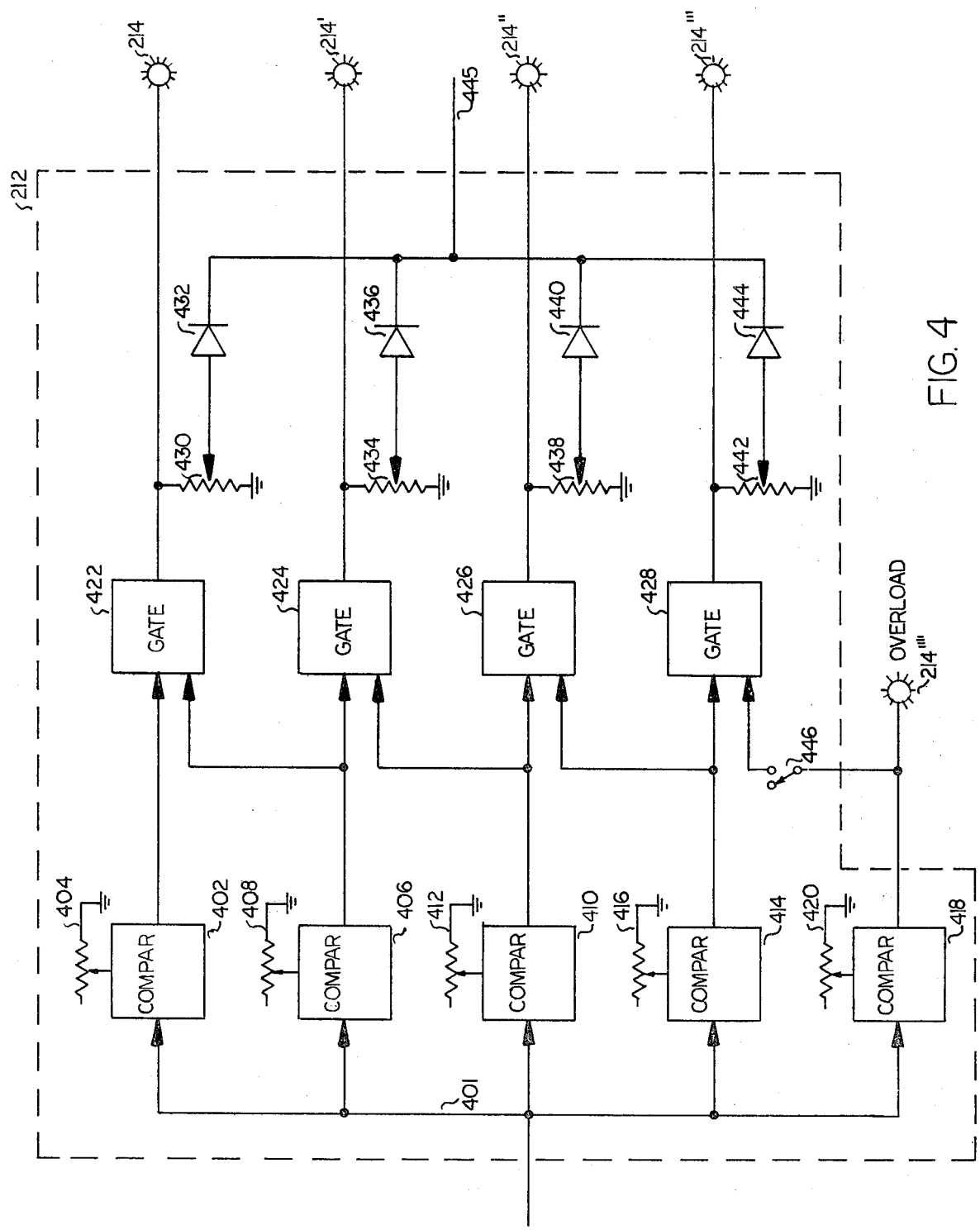
FIG. 4 shows, in some detail, the control/logic block of FIG. 2.

FIG. 4 provides, in block and schematic form, additional information concerning the control logic block 212 of FIG. 2. The output of peak detector 210 is fed to line 401 which in turn, is connected to comparators 402, 406, 410, 414 and 418. Each comparator is adjusted for different comparison points by associated potentiometers 404, 408, 412, 416 and 420 respectively. Comparator 406 is set to a higher threshold point than comparator 402, comparator 410 is set higher than comparator 406, comparator 414 is set higher than comparator 410, and finally, comparator 418 is set higher than comparator 414.

Typical adjustments would be to set comparator for a peak positive output voltage without enhancement of 90, 95, 100 and 105% for comparators 402, 406, 410 and 414 respectively. Comparator 418 is set for 125% and indicates overload and can also, if desired, be connected to inhibit enhancement by closing switch 446.

Comparator 402, feeds the input of gate 422. The control of gate 422 comes from comparator 406 and when comparator 406 threshold comparison voltage is exceeded, a positive voltage is produced, causing gate 422 to open so that the positive voltage produced by 402 does not pass through gate 422. Similarly, gate 424 is opened when comparison circuit 410 operates and gate 426 is opened when comparator 414 is activated. By this procedure, only the one light of the four lights 214, 214', 214'', and 214''' indicating the highest level condition is energized.

Also, the voltage from only one of the potentiometers 430, 434, 438 or 442 associated with the highest level comparator is energized to feed line 445 through isolation diodes 432, 436, 440, and 444. The diodes minimize interlocking effects when adjusting potentiometers 430, 434, 438, and 442. It is to be noted that in many cases the amount of enhancement required for the lower level points; i.e., those associated with comparator 402 and 406 will be higher than the enhancement of 414.

Thus, by use of the circuitry shown in FIG. 4 it is possible to determine which of a multiplicity of amplitude segments the level of the portion of the audio wave that produces positive going envelope modulation falls within. Once the determination is made, the amount of enhancement of the portion of the audio wave that produces positive going envelope modulation can be established.

As was noted in the discussion of FIG. 2, a conventional peak detector will introduce excessive hang time in many situations, if it is used to help implement FIG. 2. There are two deleterious effects to excessive hang time:

(1) It will cause enhancement of weak sounds immediately following strong sounds.

(2) Furthermore, it can cause a pumping effect wherein the change in the amount of enhancement will be noticeable.

This second problem is similar to the problem experienced by users of compressors and can be solved by either making the hang time extremely large; i.e., in the order of a second or more, or extremely short, less than say 25 ms. Because of the desire to avoid enhancement of weak sounds following strong sounds, which require enhancement in most cases, a short hang time, less than approximately 25 ms, will generally be utilized in practicing the present invention.

As pointed out in the description of FIG. 2, use of time delay (block 206) in excess of 10 ms can be disturbing to announcers who must monitor the transmitted signal. Accordingly, a lowpass filter which introduces large amounts of delay, cannot normally be used to remove low frequency droop, especially when it is necessary to transmit low frequency components at 100 Hz and lower. Such filters will introduce 10 ms, or more, of response delay and will, therefore, not allow full enhancement of certain short term sounds such as plosives in voice waves.

The reason the system is sensitive to droop is that individual amplitude comparison circuits must respond to approximately 5% differences in amplitude. Excessive droop of the detected wave will, accordingly, confuse the comparison devices and cause unnecessary switching between the degrees of enhancement.

Figure 5:
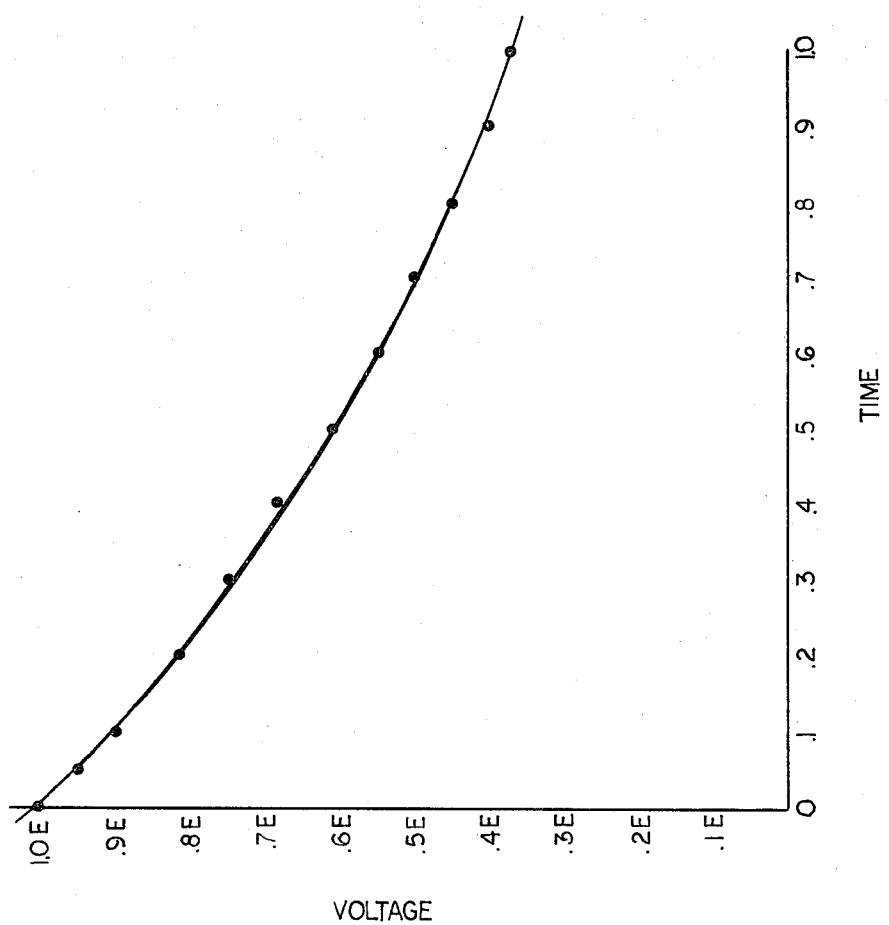
FIG. 5 shows an exponential curve indicating the points of operation pertinent to the invention.

The use of say a conventional peak detector, incorporating a large RC time constant so as to provide protection against excessive droop, has the undesirable effect of having a long hang time. For example, as further discussed below, if such a circuit is to accommodate 10 ms hold periods (the length of one cycle of a 100 Hz wave) with less than 5% droop, and the circuit is to enhance modulation over a range of 85% to 125% modulation, the hang time would be of 75.2 ms. Where the hang time is defined as the time it would take for the time constant to decay by a factor of 0.68; i.e., droop from the 125% modulation control point to just pass the 85% control point. FIG. 5, a discharge curve, illustrates the above.

Figure 6:
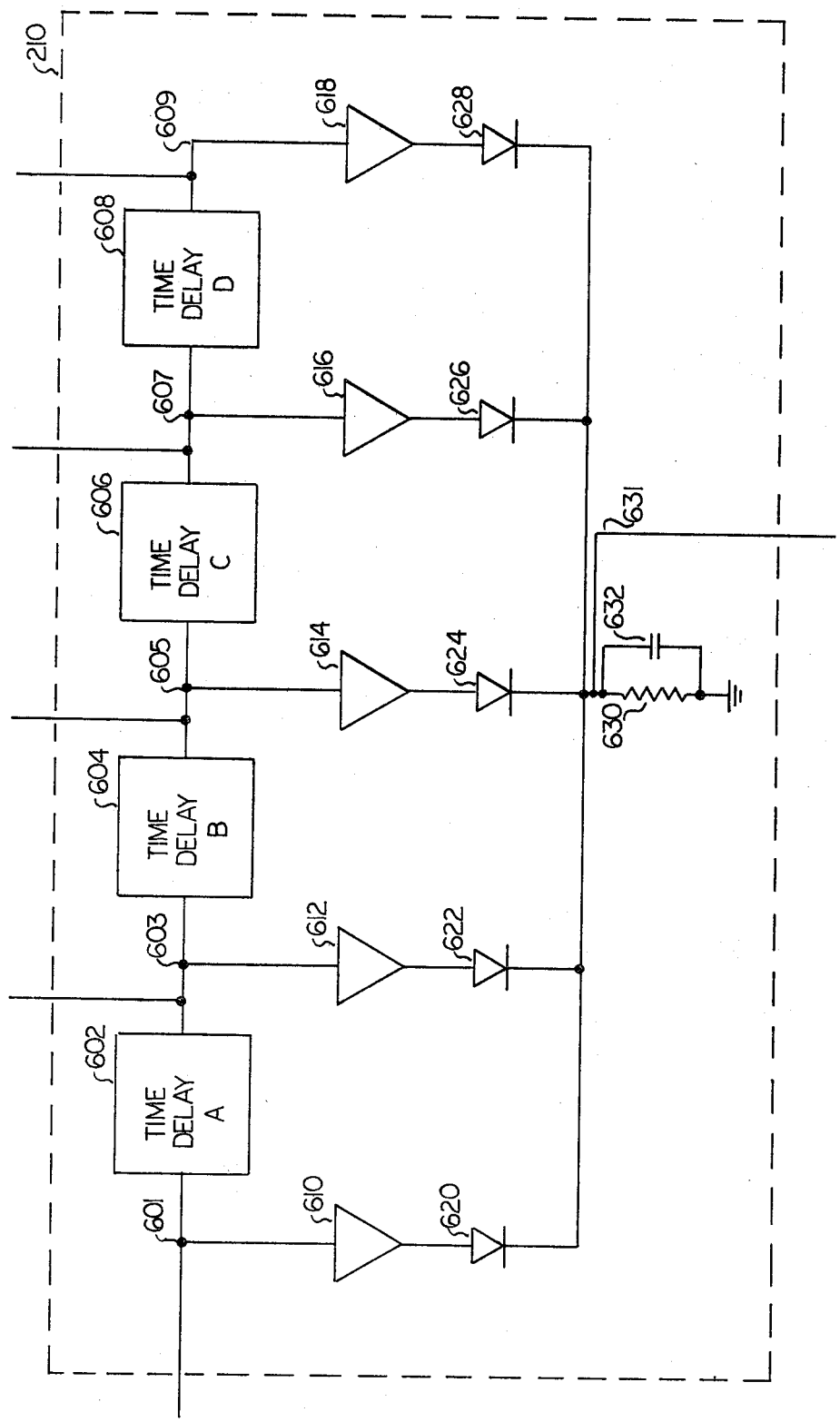
FIG. 6 shows details of a new peak detector particularly suited for use with the present overall system.

FIG. 6 shows, in block and schematic form, a type of positive peak detector which is capable of relatively low droop performance, while maintaining reasonably short hang time characteristics. It will be noted that the system, in some respects, is similar to a multiphase (polyphase) rectifier system. See, for example, Rectification p. 593 to 596, Radio Engineer's Handbook, F. E. Terman, McGraw-Hill, New York 1943.

The signal to be positive peak detected is fed to line 601 which feeds amplifier 610 which in turn feeds rectifier 620.

Rectifier 620 feeds a common load 630 and 632 which is also fed by diodes 622, 624, 626 and 628.

The signal on line 601, besides feeding amplifier 610, feeds time delay section TDa 602, which in turn feeds TDb 604, TDc 606 and TDd 608. Each of these time delay sections provides delayed signal samples having essentially the same waveshape as the undelayed signal appearing on Line 601. Electronic solid state memories, capable of producing milliseconds of delay for wideband audio waveshapes, are available. One such device is the SAD 1024A manufactured by Reticon Corporation, Sunnyvale, California. SAD 1024A is a bucket-brigade analog delay device having dual 512 stages. Two such units can be used to provide the four delay sections TDa, TDb, TDc and TDd. Details for utilizing such devices appears in the literature; for example, the application notes available from the Reticon Corporation.

The outputs of the time delay sections 602, 604, 606 and 608 are amplified in separate amplifiers 612, 614, 616 and 618 which in turn feed rectifiers 622, 624, 626 and 628.

The cathodes, assuming the positive peak of the signal is to be detected, are connected to the cathode of the undelayed signal rectifier 620 and fed to common load resistor 630 and storage capacitor 632 to produce the dc voltage representing the positive peak of the signal.

By this procedure, the peak voltage stored in capacitor 632 need be maintained without substantial delay for only one fourth the time required for a conventional peak detector. Accordingly, the hang time can be reduced.

For example, if a repetitive wave having a fundamental frequency of 100 Hz is to be detected with a conventional positive peak detector (half wave detector) the droop period would be 10 ms. If the droop amplitude is to be limited to 5% (drop from E. to 0.95E) the RC time constant would have to be:

$$e - 10 \text{ ms}/T = 0.95$$

$$\ln 0.95 = -10 \text{ ms}/T = 0.0513$$

$$T = 195 \text{ ms}.$$

But the time T is for the condition when the charge stored in C discharges to E/e i.e. 0.3679E. See FIG. 5. In the present case the hang time would extend for a short period; for example, the time the signal dropped from a peak representing 125% modulation to say a 85% modulation. Thus, assumes signal enhancement is provided for signals representing 85% positive modulation to 125% positive modulation.

Since 85%/125% = 0.68 and ln 0.68 = −0.3857 and T = 195 ms

∴ the time to drop below the 85% point = 0.3857 × 195 ms = 75.2 ms

In comparison, the hang time of the circuit shown in FIG. 6 calcuates as follows:

If we assume that the time delays of the four segments shown TDa, TDb, TDc, and TDd are equal and the same 10 ms period as in the above example, then each time delay segment should provide 2 ms of delay and capacitor 632 and resistor 630 would hold the detected voltage within 0.95E for 2 ms. Thus, the RC circuit 630 and 632 need only have one-fifth the value above used. Thus, the total hang time equals:

$$75.2 \text{ ms}/5 + 4 \times 2 \text{ ms} = 23.04 \text{ ms}$$

or about 30% of the hang time of a conventional peak detector. Larger numbers of time delay sections can be used to further reduce the hang time.

Using the values of the above example, the following simple expression can be used to determining hang time as a function of the number, D, of time delay circuit segments used:

$$75.2 \text{ ms}/(D+1) + D/(D+1)10 \text{ ms}$$

It is noteworthy that as D, the number of time delay segments (each requiring its own rectifier means) approaches ∞ the hang time would equal 10 ms; i.e., the repetition rate of the signal all of which would be in the time delay structure.

It may be seen that by use of one or more time delay means connected so as to delay at least a sample of the wave being detected and a multiplicity of rectification means one connected to a point where the wave is present prior to being delayed and the other rectification mean(s) connected to the output of the one or more time delay means and means for connecting the output of the rectification means to combining means an improved peak detector with substantially less hang time is achieved.

It is convenient, in many cases, to use the time delay sections 602, 604, 606 and 608 to delay the signal so as to provide additional time for the control function. In other words, these sections, besides being used in the peak detector circuit, can be used instead of block 206.

As mentioned above, the amount of delay used in the signal path must be limited for many stations if the announcers monitor their own on-the-air speech. Accordingly, a switching circuit may be desirable for switching the amount of delay in the signal path including the capability of completely switching out the time delay.

Leads 601, 603, 605, 607 and 609 are shown in FIG. 6 coming out of dotted box 210. These leads can be connected to a 5 position single pole switch with the arm connected to the input of block 216 to allow users to select the desired amount of delay they wish to use in lieu of time delay block 206 of FIG. 2 or one of the leads can be wired permanently to the input of block 216. Thus, if the equipment is equipped with the improved peak detector of FIG. 6, the time delay device can be used for both the delay of signal as per block 206, and to satisfy the delay requirement of the improved peak detector system.

It is a basic advantage of the present invention that the amount and nature of the distortion is less disturbing to listeners than conventional systems for providing artificial asymmetry. In order to insure full distortion advantage one should process the audio wave by multiplying the amplitude of substantially the entire portion of the wave having the polarity to be enhanced by a constant factor without substantially altering the amplitude of the portion of the wave having the opposite polarity. An equation can be written for total harmonic distortion which, due to 180° length of enhancement period, is completely free of odd harmonics.

Since odd harmonic distortion is generally considered to be more disturbing to listeners (possibly because the ear itself generally introduces even harmonic distortion, not odd harmonic distortion, and, accordingly, even harmonic distortion sounds "natural") this is an important advantage of the preferred embodiment of this invention.

Considering the enhancement of a sine wave for the 180 degree period a Fourier series may be written for the altered waveshape based on the well known Fourier series of a half wave rectified sine wave:

$$\frac{nE}{\pi}\left(1 + \frac{\pi}{2}\cos wt + \frac{2}{3}\cos 2wt \frac{-2}{15}\cos 4wt + \frac{2}{35}\cos 6wt \ldots (-1)^{\frac{m}{2}+1} \frac{2}{m^2-1}\cos m\,wt \ldots \right) + E\cos wt$$

where n is equal to the enhancement ratio $-1$ and where m, the harmonic term, is even.

As noted above, the wave is free of odd harmonic terms. This is due to the 180 degree enhancement period used and assumes freedom from clipping and other forms of distortion.

From this series a simple relationship can be established for calculating the total root mean square distortion of the wave up to the first 10 harmonic terms.

Total harmonic distortion $= 0.2175\, n/(1+n/2)$

Thus, for an enhancement factor of 1.25; i.e., enhancement that would cause an 100% AM wave to produce 125% positive modulation and 100% negative going modulation, n=0.25 and, accordingly, a total harmonic distortion of 4.83% would result.

In comparison, a clipper circuit set to provide the same degree of asymmetry would produce harmonic distortion of 7.01% distortion. Furthermore, the clipper would introduce substantial odd harmonic distortion.

From the foregoing, further variations, modifications, and applications of the invention will be apparent to those skilled in the art to which the invention is addressed, within the scope of the following claims.

What is claimed is:

1. Audio signal modulation equipment comprising an audio signal source, carrier wave generation means, and means for modulating carrier waves with the audio signal, the improvement which comprises;
   means for converting an audio signal, having little or no asymmetry, to a wave having substantial asymmetry through which an audio signal from said audio signal source is passed and fed to the carrier wave modulating means,
   said converting means, comprising a peak detector which detects the signal having the proper polarity to cause positive going envelope modulation, and,
   means controlled by the peak detector for providing greater transmission for portions of the audio wave that produce positive going envelope modulation than portions of the audio wave that produce negative going modulation during periods when the peak detector provides an output above a predetermined level.

2. Audio signal modulation equipment according to claim 1, with the addition of time delay wherein a time delay input circuit is connected after a signal point feeding the peak detector and its output is connected to the input of the means for providing greater transmission for some portions of the signal wave than other portions.

3. Audio signal modulation equipment, according to claim 1 wherein said peak detector comprises;
   (a) a first rectification means with its input terminal coupled to the signal having the proper polarity to cause positive going envelope modulation,
   (b) one or more additional rectification means,
   (c) one or more time delay means through which at least a sample of said proper polarity signal is passed and if a plurality of delay means are provided said delay means connected so as to provide a total delay equal to the sum of the delays of the individual delay means,
   (d) means for connecting the input terminals of the one or more rectification means (b) to the one or more output terminals of delay means (c),
   (e) combining means connected to the output terminals of rectification means (a) and rectification means (b).

4. The method of modifying an audio wave so as to produce a wave with the peak voltage of one polarity of the wave greater than the peak voltage of the other polarity so as to be suitable for causing asymmetrical modulation of an AM transmitter comprising;
   (a) detecting the peak voltage of the input wave having the polarity which is to be enhanced, and,
   (b) multiplying the amplitude of substantially the entire portion of the wave having the polarity to be enhanced by a constant factor, said factor being a function of Step (a) without substantially altering the amplitude of the portion of the wave having the opposite polarity.

5. The method of claim 4 incorporating an additional step of delaying the wave controlled in Step (b) without causing substantial delay in the initial response of the detecting step (a).

6. The method of claim 5 wherein the delay is approximately 5 ms.

7. The method of claim 4 wherein Step (b) causes sufficient enhancement to frequently produce +125% modulation of an associated amplitude modulated transmitter while maintaining negative going modulation peaks at 100% or at slightly less.

8. An audio processing device for converting symmetrical and approximately symmetrical waves to substantially asymmetrical waves comprising;
(a) means for separating the portion of the wave which has the polarity which is to be made larger in amplitude, from the full wave,
(b) substantially linear means for passing the separated portion of means (a) to summation means, and,
(c) substantially linear means, having a higher transmission loss than linear means (b) for passing the remaining portion of the wave to the summation means.

9. A detector for detecting the peak voltage of a wave comprising;
(a) a first rectification means with its input terminal coupled to the signal having the proper polarity to cause positive going envelope modulation,
(b) one or more additional rectification means,
(c) one or more time delay means through which at least a sample of said proper polarity signal is passed and if a plurality of delay means are provided said delay means connected so as to provide a total delay equal to the sum of the delays of the individual delay means,
(d) means for connecting the input terminals of the one or more rectification means (b) to the one or more output terminals of delay means (c),
(e) combining means connected to the output terminals of the rectification means (a) and rectification means (b), said combining means incorporating storage means having a capacity sufficient to maintain the level of the detected wave within a predetermined droop tolerance for a period of time equal to approximately $T/D+T$ where T is the period of one complete alternation of the lowest frequency component of substantial level expected in the wave being detected and D is the number of time delay means (c).

10. The method of processing an audio wave so as to make said wave suitable for asymmetrical modulation of an AM transmitter comprising;
(a) detecting the peak voltage of the input wave having the polarity which is to be enhanced, and,
(b) multiplying the amplitude of substantially the entire portion of the wave having the polarity to be enhanced by a constant factor said factor being a function of step (a) without substantially altering the amplitude of the portion of the wave having the opposite polarity, the peak detecting step (a) comprising the following steps:
(1) processing the wave to be detected in such a fashion as to provide, in addition to the original wave to be detected one or more delayed samples of said wave,
(2) separately rectifying the input wave as well as the output of each of the one or more delayed samples,
(3) combining the resulting separately rectified waves.

11. A device for converting a substantially symmetrical wave into one substantially asymmetrical comprising;
means for splitting said wave into its positive and negative polarity segments,
two separate paths at least for some portion of the path to an associated transmitter's modulator for passing the two segments, said separate paths having different transmission characteristics both of which are essentially linear, but the path for the segment that causes positive going modulation being of higher transmission gain.

12. A device according to claim 11 wherein the transmission gain of the path for positive going modulation is 25% greater than that of the path for negative going modulation.

13. The method of processing audio waves so as to make them more suitable for modulating amplitude modulated transmitters, comprising;
(a) determining if the portion of the wave having the proper polarity to cause positive going modulation presently has a level exceeding a predetermined level,
(b) enhancing the amplitude of said portion of the wave without materially increasing the amplitude of the portion of the wave causing the negative going modulation after step (a) determines the level is exceeded, and
(c) discontinuing enhancement as per Step (b) subsequent to the time when the portion of the wave that causes positive going modulation drops below the predetermined level of determination step (a).

14. The method of claim 13 where step (c) is performed within approximately 25 ms after said drop in level.

15. The method of claim 13 wherein an additional step is provided for determining if the level exceeds a second predetermined level and changing the amount of enhancement if the second predetermined level is exceeded.

16. The method of processing an audio wave so as to make it more suitable for modulating associated AM transmitting equipment comprising;
(a) determining which of a multiplicity of amplitude segments the level of the portion of the audio wave that produces positive going envelope modulation falls within, and,
(b) enhancing the portion of the audio wave that produces positive going modulation without equally enhancing the other portion of the audio wave as a function of the step (a) determination.

* * * * *

UNITED STATES PATENT AND TRADEMARK OFFICE
CERTIFICATE OF CORRECTION

PATENT NO.   :   4,295,106
DATED        :   October 13, 1981
INVENTOR(S)  :   Leonard Kahn It is certified that error appears in the above–identified patent and that said Letters Patent is hereby corrected as shown below:

Col. 1, line 64  "even" should read "odd"

Signed and Sealed this

Twenty-sixth Day of October, 1993

Attest:

BRUCE LEHMAN

Attesting Officer

Commissioner of Patents and Trademarks